(12) United States Patent
Günther et al.

(10) Patent No.: US 7,865,346 B2
(45) Date of Patent: Jan. 4, 2011

(54) INSTRUCTION ENCODING IN A HARDWARE SIMULATION ACCELERATOR

(75) Inventors: Gernot E. Günther, Endicott, NY (US); Viktor Gyuris, Wappingers Falls, NY (US); Kevin Anthony Pasnik, Cedar Park, TX (US); Thomas John Tryt, Binghamton, NY (US); John H. Westermann, Jr., Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 936 days.

(21) Appl. No.: 11/694,940

(22) Filed: Mar. 30, 2007

(65) Prior Publication Data

US 2008/0243462 A1 Oct. 2, 2008

(51) Int. Cl.
*G06F 17/50* (2006.01)
*G06G 7/62* (2006.01)
*H03K 19/00* (2006.01)

(52) U.S. Cl. ............................. 703/13; 703/15; 716/4; 716/17

(58) Field of Classification Search .................... 703/13, 703/15; 716/4, 17
See application file for complete search history.

(56) References Cited

U.S. PATENT DOCUMENTS 5,063,499 A * 11/1991 Garber ......................... 703/27
7,191,111 B2 3/2007 Schuppe
2003/0105617 A1 * 6/2003 Cadambi et al. .............. 703/14
2006/0190232 A1 8/2006 Guenther et al.
2006/0277020 A1 12/2006 Ganesan et al.
2007/0044079 A1 2/2007 Ganesan et al.
2007/0244678 A1 * 10/2007 Averill et al. .................. 703/7

OTHER PUBLICATIONS

Cock, et al., "A Proposed Hardware Fault Simulation Engine", University of Manchester, 1991, pp. 570-574.
Darringer, et al., "EDA in IBM: Past, Present, and Future", Transactions on Computer Aided Design of Integrated Circuits and Systems, vol. 19, No. 12, Dec. 2000, pp. 1476-1497.
Kayser, et al., "Hyper-acceleration and HW/SW co-verification as an essential part of IBM eServer Z900 verification", IBM J. Res. & Dev., vol. 46, No. 4/5, Jul./Sep. 2002, pp. 597-605.

* cited by examiner

*Primary Examiner*—David Silver
(74) *Attorney, Agent, or Firm*—Ojanen Law Offices; Karuna Ojanen

(57) ABSTRACT

A hardware simulation accelerator to simulate logic designs, a method to encode instructions for use in the hardware simulation accelerator, and a computer program product having code of the method by which the hardware simulation accelerator can read encoded instructions to simulate the logic design, and computer program product of the encoded instructions to simulate a logic design in a hardware accelerator. Each instruction has one of a plurality of opcodes, the opcodes select which of the hardware resources of the hardware simulation accelerator will implement and use the values set forth in other programmable bits of the encoded instruction. The encoded instruction may be a routing and/or a gate evaluation instruction.

13 Claims, 9 Drawing Sheets

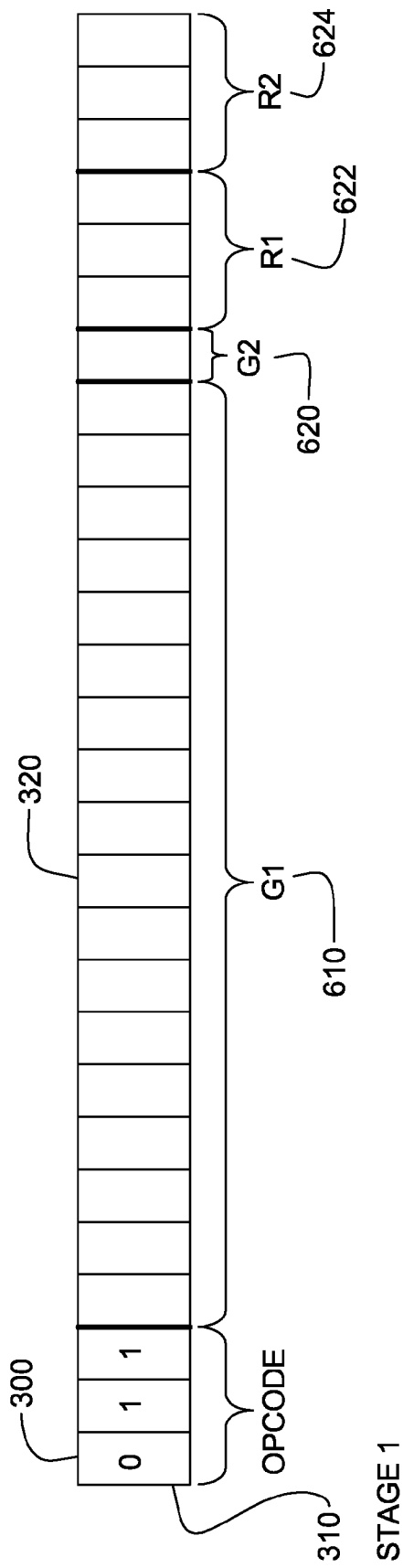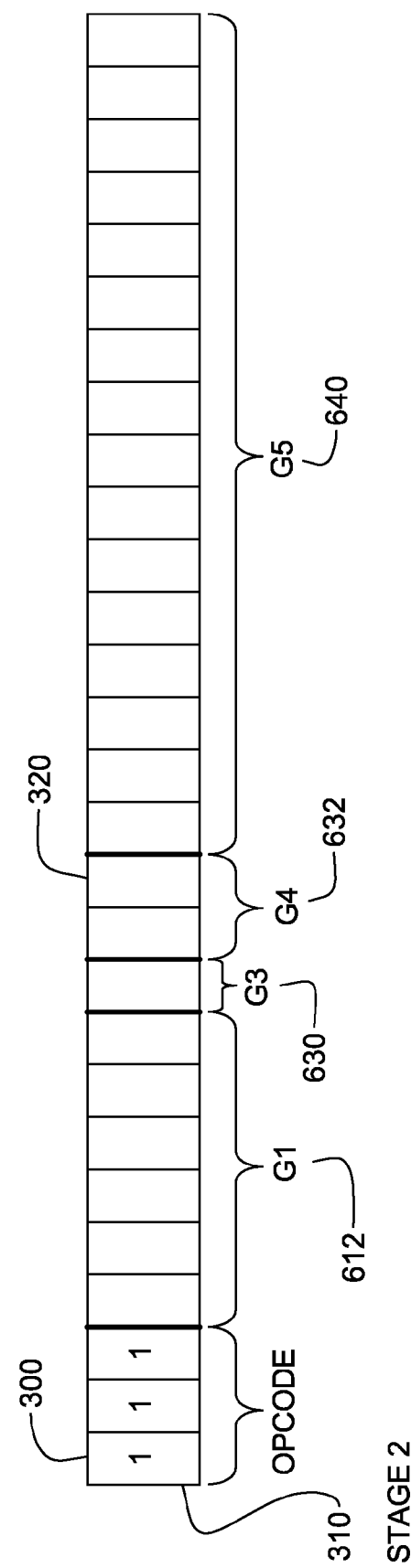

| OPCODE | TYPE | G1 | G2 | G3 | G4 | R1 | G5 | R2 | R3 | R4 | R5 | R6 | R7 | R8 | TOTAL USED BITS |
|---|---|---|---|---|---|---|---|---|---|---|---|---|---|---|---|
| 000 | ROUTING | | | | | 3 | | 3 | 6 | 3 | 3 | 3 | | | 24 |
| 0010 | ROUTING | | | | | 3 | | 3 | 6 | 3 | 3 | | 5+1 | | 28 |
| 0011 | ROUTING | | | | | 3 | | 3 | 6 | 3 | 3 | | | 5+1 | 28 |
| 010 | GATE 3/4 (STAGE 1) | 18 | 1 | | | 3 | | | | 3 | | | | | 28 |
| 011 | GATE 3/4 (STAGE 1) | 18 | 1 | | | 3 | 3 | | | | | | | | 28 |
| 100+00 | GATE 1 | 6 | | 1 | 2 | 2 | 3 | | 3 | 3 | 3 | | | | 28 |
| 100+01 | GATE 1 | 6 | | 1 | 2 | 2 | 3 | | 3 | | | | 5+1 | | 28 |
| 100+10 | GATE 1 | 6 | | 1 | 2 | 2 | 3 | 6 | 3 | | | | | | 28 |
| 100+11 | GATE 1 | 6 | | 1 | 2 | 2 | 3 | | 3 | | | | | 5+1 | 28 |
| 101+00 | GATE 2 | 12 | 1 | 1 | 2 | 4 | | | | 3 | | | | | 28 |
| 101+01 | GATE 2 | 12 | 1 | 1 | 2 | 4 | | | 3 | | | | | | 28 |
| 101+10 | GATE 2 | 12 | 1 | 1 | 2 | 4 | 3 | | | | | | | | 28 |
| 101+11 | GATE 2 | 12 | 1 | 1 | 2 | 4 | | | | | | 3 | | | 28 |
| 110+00 | GATE 3 (STAGE2) | | | 1 | 2 | 8 | 3 | | 3 | 3 | 3 | | | | 28 |
| 110+01 | GATE 3 (STAGE2) | | | 1 | 2 | 8 | 3 | | 3 | | | | 5+1 | | 28 |
| 110+10 | GATE 3 (STAGE2) | | | 1 | 2 | 8 | 3 | 6 | 3 | | | | | | 28 |
| 110+11 | GATE 3 (STAGE2) | | | 1 | 2 | 8 | 3 | | 3 | | | | | 5+1 | 28 |
| 111 | GATE 4 (STAGE2) | 6 | | 1 | 2 | 16 | | | | | | | | 5+1 | 28 |

FIG. 7

INSTRUCTION ENCODING IN A HARDWARE SIMULATION ACCELERATOR

BACKGROUND OF THE INVENTION

1. Technical Field

This invention generally relates to the field of developing and modeling logic designs, and more specifically relates to simulating hardware designs in a hardware simulation accelerator having encoded instructions.

2. Background Art

Designing logic circuits, whether they be a single functional unit such as an adder or a memory unit, or a chip, or an entire computer system, is a process or flow in which an initial concept of a new product is transformed into a detailed blueprint. Understandably, detecting errors at early stages saves time and engineering resources, especially for complex logic designs. Computer-aided design (CAD) tools and electronic design automation (EDA) allow logic designers to create and model new designs and understand their complexity prior to production. Modeling and verifying logic designs with CADs, EDAs, and simulation tools significantly accelerate the design process and reduce the time to market, thereby offering a competitive advantage to those developers having the fastest and most accurate EDA tools. The typical logic design process describes the logic in Very high speed IC Hardware Description Language (VHDL) or other hardware description language, such as Verilog. A netlist describing the interconnection topology or connectivity is input into a simulation environment to verify the logic of the design.

Among the verification tools are simulators and hardware simulation accelerators that model the function and performance of hardware in software, or in hardware-accelerated software simulation systems, or in hardware emulation systems that use a combination of software and hardware to model a circuit or system design. Simulation is broadly defined as the creation of a model of the logic design which, if subjected to arbitrary stimuli, responds in a similar way to the manufactured and tested design. More specifically, the term simulation is typically used when such a model is implemented as a computer program. Simulation has long been a preferred method for verification of logical correctness of complex electronic circuit designs. In contrast, the term emulation is the creation of a model using programmable logic or field-programmable gate array (FPGA) devices including arrays of multiplexers, also called muxes. Simulation and emulation enable designers to detect design errors before the expensive manufacturing process is undertaken. One advantage of emulation over simulation is speed but emulation may lack access to internal nodes needed for detailed analysis. Simulation acceleration using a special purpose hardware simulation accelerator offers the advantages of software simulation and increased speed of emulation.

Hardware simulation accelerators were developed to provide the massive simulation horsepower needed to verify huge and complex logic circuits, such as large parallel and/or pipelined processors with multiple levels of memory caches and many processing registers. One robust hardware simulation accelerator, the Engineering Verification Engine (EVE) used a massive network of Boolean function processors that were each loaded with up to 8192 logic instructions. Typically, each run through a sequence of all instructions in all logic processors in parallel constituted one machine cycle, thereby implementing the cycle-based simulation paradigm. The theoretical speed of EVE was many orders of magnitude faster than any software implementation, up to 2.2 billion gate evaluations per second and EVE's value to a given project was determined by the design's intended throughput in cycles per second (cps). A multiprocessor model with the full storage hierarchy and input-output (I/O) boards achieved between 250 cps and 1000 cps on EVE compared with 0.5 cps for the software model run on a mainframe.

In the late 1990s, IBM built the AWAN hardware simulation accelerator as a low-cost system with improved capacity and performance. AWAN had smaller and faster components and an interconnection strategy that was significantly improved over EVE. Models of integrated circuits exceeding 31 million gates were simulated wherein the simulation speed depended on the configuration, model size, model complexity, and the amount of host interaction. The raw model performance of the POWER4 chip running on Awan exceeded 2500 cycles per second. Utilizing the basic EVE concepts, a hyper-acceleration and emulation machine called ET3 was developed in CMOS technology. ET3 used logic processors which evaluated three- and four-way input gates. ET3 had a larger number of processors and a lower depth of sequential three-way-gate instructions per processor, 256 versus 8k in EVE or 128k in AWAN. The higher degree of parallelization resulting in dramatically higher speeds of 50,000 to 1M cps but at a much higher hardware price.

So, generations of hardware simulation accelerators have been developed and are now parallel computers with fields of application specific integrated circuit (ASIC) chips. The flattened netlist of the design under test is mapped to these fields of chips. The segment of the netlist that is mapped to a given simulator chip is stored in a compiled format in the instruction memory. The instruction memory is often large and located on the same chip as the processor. During simulation, rows of the instruction memory are read sequentially and piped to a logic evaluation unit, such as a processor. Based on the received instructions, a logic evaluation unit simulates the represented segment of the netlist. In most hardware simulation accelerators, each logic evaluation unit has a dedicated instruction memory that supplies the instruction stream to its respective logic evaluation unit. For modern accelerators such as the AWANNG, the instruction memory is located on the chip and often takes up half of the die's area. The capacity of hardware simulation accelerators is determined largely by the size of the instruction memory. For AWANNG, the architecture was designed to provide sufficient routing resources to achieve optimal gate utilization.

With reference to FIG. 1, a typical instruction 100 is shown. In a prior art instruction 100, the width of the instruction matches the exact number of bits 102 necessary to program all the resources such that there exists a one-to-one mapping of groups of bits to corresponding hardware resources programmed by these bits. By way of example, a group of bits 110 is required for gate evaluation of the logic at hardware resource G1; another field of bits 112 is required to program gate evaluation at hardware resource G2; a number of bits 118 is used to program gate evaluation at hardware resource Gn, and so on. Thus, for each hardware resource, there are a number of bits. Similarly for routing, a fixed number of bits 120 will be used for routing to/from hardware resource R1; a fixed number of bits are used in field 126 to route instructions/logic to/from hardware resource Rm. Another example is that a particular set of 16 instruction memory bits is always be used to program a 16 bit function table. Thus, the total number of bits needed to program all the gate evaluations and routing resources determine the required total width of the instruction memory. In the prior art instruction of FIG. 1, each memory instruction programs all the gate evaluations and routing resources even though a hardware resource may not be needed to execute that instruction. Now, in general, the overall capacity of a simulator is measured in the number of possible gate evaluations. When there are insufficient routing resources in the instructions, the instructions become shorter and there is room for more instructions in total. The overall capacity of the simulator, however, is reduced because routing becomes a bottleneck; many of the instructions cannot be used for gate evaluations because the gate inputs are not available yet. If too many routing resources are added to the architecture, the instructions are wider than necessary and thus fewer instructions will fit in the memory. Given the typical case of one gate evaluation per instruction, this also reduces the overall capacity; thus in this case, gate evaluations become the bottleneck and some memory bits that are available for routing remain unused. Balancing the number of bits in an instruction between gate evaluations and routing resources is difficult to achieve. In fact, how much routing is needed depends on the characteristics of the logic design under test. Therefore there will always be instructions having a fixed designation of bits wherein some bits needed for gate evaluation and/or for routing are unused. The inventors understood that these unused bits in a memory instruction for a hardware simulation accelerator constitute wasted overall capacity.

SUMMARY

Disclosed and taught herein is a hardware simulation system having a simulation model of a logic design to be simulated in a hardware simulation accelerator, the hardware simulation accelerator comprising: one or more simulator chips, each chip having one or more logic evaluation units having many hardware resources; there is an instruction memory associated with each logic evaluation unit and the instruction memory has a plurality of encoded instructions to simulate the simulation model using the hardware resources wherein the logic evaluation unit is connected to receive the encoded instructions from its instruction memory; and an instruction decode logic is connected between the instruction memory and its logic evaluation unit to decode each encoded instruction into an opcode and a data part having a plurality of encoded bits, the opcode determining which and how hardware resources use encoded bits of the data part. The opcode may indicate that the instruction is used to evaluate a logical function in the simulation model. The opcode may further indicate that some encoded bits in the data part will select operands for evaluation of the logical function. The opcode may further indicate that some encoded bits in the data part are used to program either a source or a destination of a particular set of routing resources.

Also disclosed herein is a method to increase the model capacity of a hardware simulation accelerator having a plurality of hardware resources, the method comprising the steps of: for each of the plurality of hardware resources analyzing how often the hardware resource will be used in simulating a logic design input into the hardware simulation accelerator, how often a setting of the hardware resource needs to change, and whether a particular setting for a hardware resource is more prevalent than other settings so that the particular setting can be a default setting. The method further comprises determining that the hardware resource always needs to be set and determining the values of others of the plurality of hardware resources when the hardware resource is not set to the default setting; and then creating a plurality of categories of encoded instructions and for each of the plurality of categories of encoded instructions, defining a first combination of hardware resources that are always set; defining one or more second combinations of the hardware resources that are set together with the first combination; and then creating an encoded instruction for the second combination, each encoded instruction having an opcode and a data portion of the instruction, the opcode determining which of the plurality of hardware resources to set, and the data portion setting the values of the plurality of hardware resources determined by the opcode.

Further disclosed and taught herein is a method of decoding an encoded instruction to simulate a logic design in a hardware simulation accelerator, the hardware simulation accelerator having many simulator chips, each of the simulator chips having at least one logic evaluation unit and a respective memory, the method comprising the steps of: mapping a partition of the logic design to a logic evaluation unit; loading the encoded instruction into the respective memory of the at least one logic evaluation unit; reading an opcode of the encoded instruction; and determining the decoded instruction is either a gate evaluation instruction and/or a routing instruction. When the instruction is a gate evaluation instruction, others of a plurality of bits in the encoded instruction are decoded to select one or more operands for the gate evaluation. Still others of the bits of the encoded instruction can be used to determine a function evaluated by the gate evaluation. Still others of the plurality of bits of the encoded instruction may be programmed to select a source or a destination of the instructions.

A computer program product comprising a computer usable medium storing computer usable program code for creating encoded instructions of a simulation model of a logic design to be executed in a hardware simulation accelerator is further disclosed herein, the computer program product comprising: computer usable program code to read a netlist of logic design; computer usable program code to determine the timing and kinds of a plurality of hardware resources in the hardware simulation accelerator that will simulate the netlist of the logic design; computer usable program code to compile the netlist of the logic design into a simulation model having a plurality of programmable instructions; computer usable program code to determine which hardware resources of the hardware accelerator can best be implemented using one of the programmable instruction; computer usable program code to create an opcode for one of the programmable instructions to program each of those hardware resources that can best be implemented using a programmable instruction; computer usable program code to program other fields in the programmable instruction to implement the operation indicated by the opcode on those hardware resources indicated by the opcode.

Further realized by the inventors is a computer program product comprising a computer usable medium storing encoded instructions to simulate a logic design in a hardware accelerator having a plurality of hardware resources, the computer program product having a plurality of encoded instructions, each of the encoded instructions having an opcode and a data part, the data part having a plurality of encoded bits wherein the opcode of the encoded instruction causes one or more of the plurality of hardware resources to simulate the logic design in accordance with the encoded bits of the data part. Other bits of the programmable instructions may be used for other purposes, such as latch and/or value selection, setting a breakpoint or other conditional pause in the execution of the plurality of instructions.

Disclosed herein is a hardware simulator having a memory associated with each logic evaluation unit, the memory having encoded instructions of a plurality of bits that are programmable for gate evaluation or for routing or a combination thereof. Because there are no longer a fixed number of bits used exclusively for gate evaluation and a fixed number of bits used exclusively for routing, previously reserved but unused bits may now be used for other purposes. Instruction encoding is a new concept for hardware simulation accelerators.

Also disclosed herein is a method to program hardware simulation logic. Rather than programming all of the hardware resources, e.g., operand select multiplexers, function lookup table, memory readports and shift register readports with an instruction to set its value in every cycle, etc., some bits in the instruction determine which entities are to be programmed or set for the cycle and which are not. Encoding a memory instruction may require a lookup table. Decoding an instruction translates the instruction into enable signals for logic that may, for example be accomplished through the use of multiplexers. The implementation of the decoding is thus specific to the encoding in the instructions. The entities that do not require programming or setting for the cycle can retain their previous value from a prior cycle, can be reset to original values, or may take on a default value, as appropriate depending upon which behavior is best for which resources. A compiler that does the encoding determines the best behavior and every time, the complier programs a particular resource, it determines first whether the resource is encodable.

According to a preferred embodiment, a simulator system with a hardware simulation accelerator has flexible encoded instructions. A fixed or variable length instruction code or "opcode" that is part of each instruction determines which entities or resources are programmed with the remaining bits of the instruction. A certain amount of bits is lost to instruction encoding but by optimally encoding, waste of instruction memory bits to program unused resources is practically eliminated, thereby increasing the overall capacity of the simulator.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and:

FIGS. 6A and 6B are simplified illustrations of an example of an encoded instruction having more than one stage that can be used for logic gate evaluation in a hardware simulation accelerator.

FIG. 7 is an example of an instruction encoding that can be used to program instructions for use in a hardware simulation accelerator.

DETAILED DESCRIPTION, ENABLEMENT AND BEST MODE

The encoded instructions presented herein are implementable in a hardware simulation accelerator of a hardware simulation system. Simulation systems model hardware systems or logic components in software. Hardware emulation is a technology related to simulation and is also used to model a hardware design. A simulator with an accelerator typically includes a host computer, such as a workstation, that communicates with the accelerator. An accelerator typically includes one or more arrays of hardware such as multiplexers programmed to represent the hardware function or functions necessary to implement the current model.

The encoded instructions can take the form of an entirely hardware embodiment, an entirely software embodiment or an embodiment containing both hardware and software elements. In a preferred embodiment, the instructions may be implemented in software, which includes but is not limited to firmware, resident software, microcode, etc.

Furthermore, the instructions can take the form of a computer program product accessible from a computer-usable or computer-readable medium providing program code for use by and in connection with a computer or any instruction execution system. For the purposes of this description, a computer usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or a semiconductor system or apparatus or device or a propagation medium. The propagation medium may be an electrically conductive wire or cable, an optical cable; even air is a propagation medium for wireless communication. Examples of a computer-readable medium include a semiconductor solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and a digital versatile disk (DVD).

Figure 2:
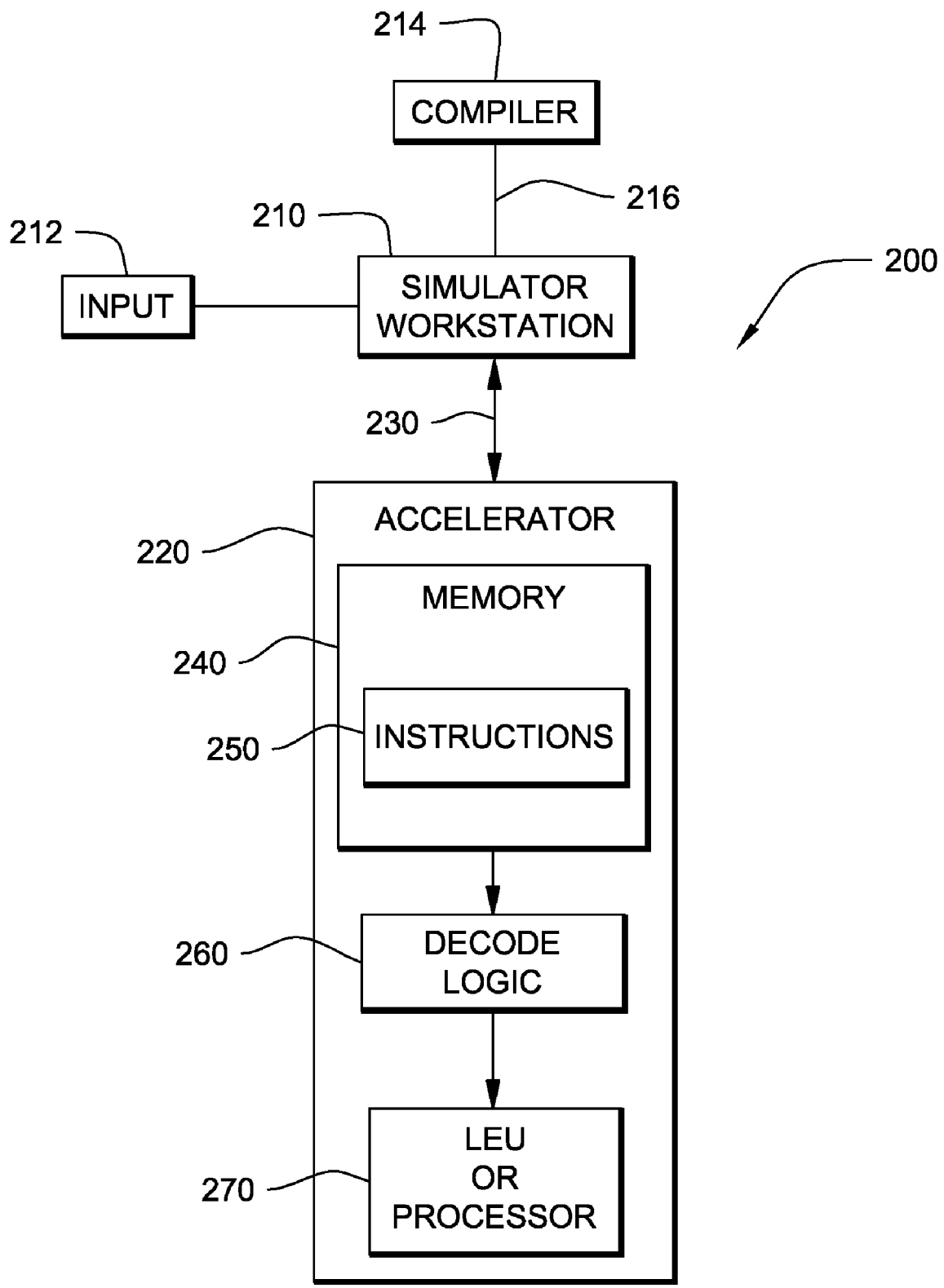
FIG. 2 is a simplified block diagram of a workstation-based simulation environment capable of implementing encoded instructions.

Referring now to FIG. 2, a data processing system, such as hardware simulation system 200 includes a workstation 210 connected to a hardware simulation accelerator 220 through a communication link 230. Either or both the simulation system 200 and the workstation 210 are suitable for storing and/or executing program code and each has at least one processor coupled directly or indirectly to memory elements through a system bus or other communications link 230. Communications link 230 allows for bidirectional or unidirectional communication from the workstation to the accelerator 220, and may be a wire, a wireless link, a cable, fiber optics, etc. and is intended to include a variety of networks and protocols, such as a WAN or the Internet. Network adapters may also be coupled to the workstation 210 and/or hardware simulation accelerator 220 to enable the data processing system to become coupled to other data processing systems or remote printers or storage devices through intervening private or public networks. Modems, cable modem and Ethernet cards are just a few of the currently available types of network adapters. Workstation 210 may be any type of microprocessor-based computer or computer system known to those skilled in the art having appropriate user and application program interfaces for input/output devices 212. Input/output (I/O) devices 212 include but are not limited to keyboards, displays, pointing devices, vocal and audible devices and can be coupled to the workstation 210 and/or hardware simulation accelerator 220 either directly or through intervening I/O controllers.

The hardware description language, VHDL, of a logic design is converted to a netlist. The flattened netlist, i.e., a netlist in which the hierarchical arrangements have been removed, is mapped onto a place and route layout onto a field of chips called a model file 216 by a compiler 214. The model file 216 created by the compiler 214 is input to the simulator workstation 210 that distributes the model file 216 to various partitions of the hardware simulation accelerator 220, for instance, different clusters of different processors. By way of example only, a hardware simulation accelerator 220 may have hundreds of parallel processors clustered into groups of processors. The model file 216 contains gate evaluation and routing instructions 250 for the thousands of logic evaluation units 270 and/or timing and/or routing hardware resources of all these processors. The simulator workstation 210 loads instructions 250, all of which make up the simulation model file 216 of the logic design, i.e., the model file 216, into the instruction memory 240 of the hardware simulation accelerator 220. Instruction 250 are read sequentially at a constant speed and piped to the processor or other logic evaluation unit 270. In the preferred embodiments, at least some of the instructions 250 in the instruction memory 240 are encoded instructions in accordance with the teachings herein. The processor or other logic evaluation unit 270 in turn simulates the represented segment of the netlist.

Hardware simulation accelerator 220 is a large-scale hardware configuration implemented with programmable logic such as multiplexer arrays, selectors, and other custom hardware. Both the workstation 210 and the hardware simulation accelerator 220 have memory elements that can include local memory employed during actual execution of the program code, bulk storage, and cache memories which provide temporary storage of at least some program code and instructions in order to reduce the number of times the code must be retrieved from bulk storage during execution. Hardware accelerator 220 may have hundreds, thousands of processors or other logical evaluation units 270 and other hardware resources, including multiplexers, registers, and memory readports and other arrays and hardware to be programmed in order to represent the hardware function(s) necessary to implement a logic design. These hardware resources are programmed to, e.g., evaluate a logic function, read or write an array, or route data on the chip or between chips. Some of these hardware resources used for logic evaluation may include operand select multiplexers, function lookup tables, the choice of a latch, the choice of a value of a latch, etc. Other entities such as memory readports or shift register readports are used primarily for routing data. The outputs of gate evaluations or memory read ports are routed as inputs to other gates or memory write ports. The number and type of hardware resources will depend upon the logic design that is being simulated in the hardware simulation accelerator 220.

Figure 1:
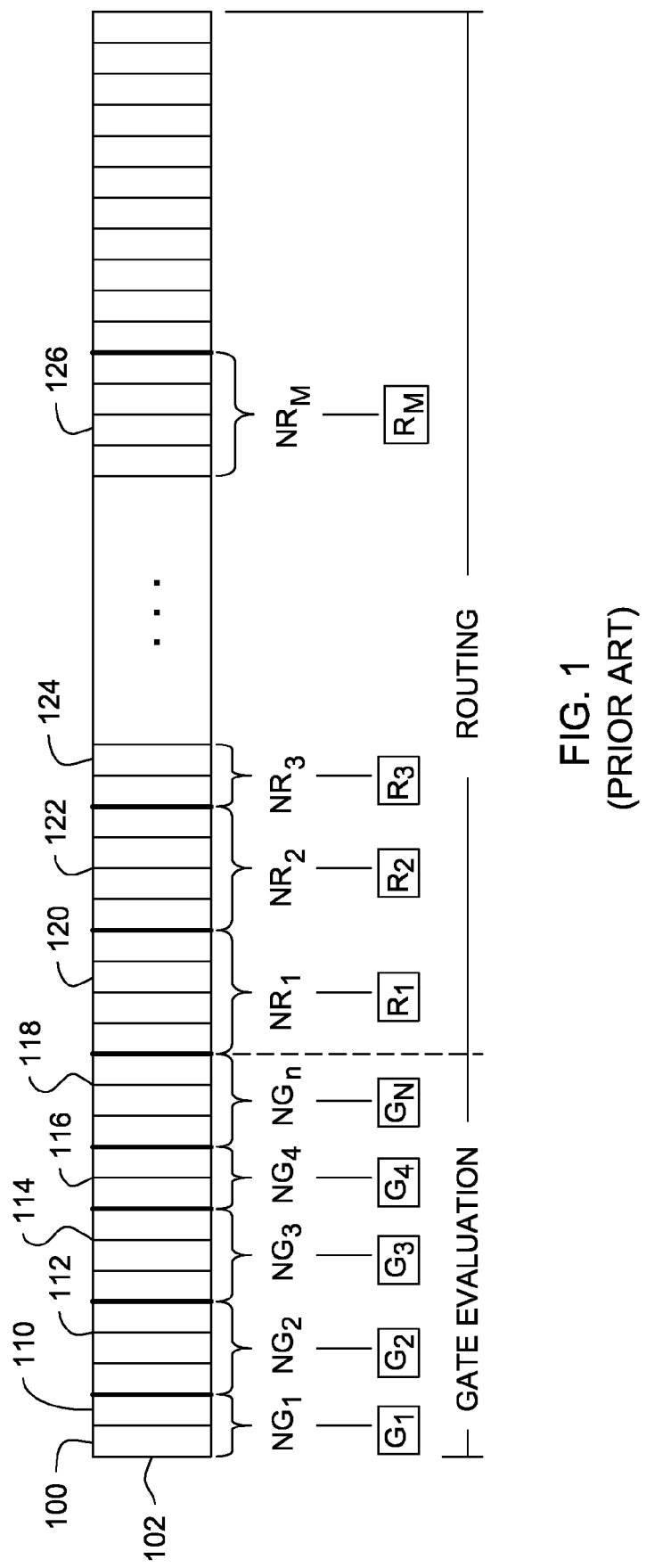
FIG. 1 is a simplified illustration of a prior art memory instruction having a fixed number of bits in relation to the resources of and for use in a hardware simulator.
Figure 3:
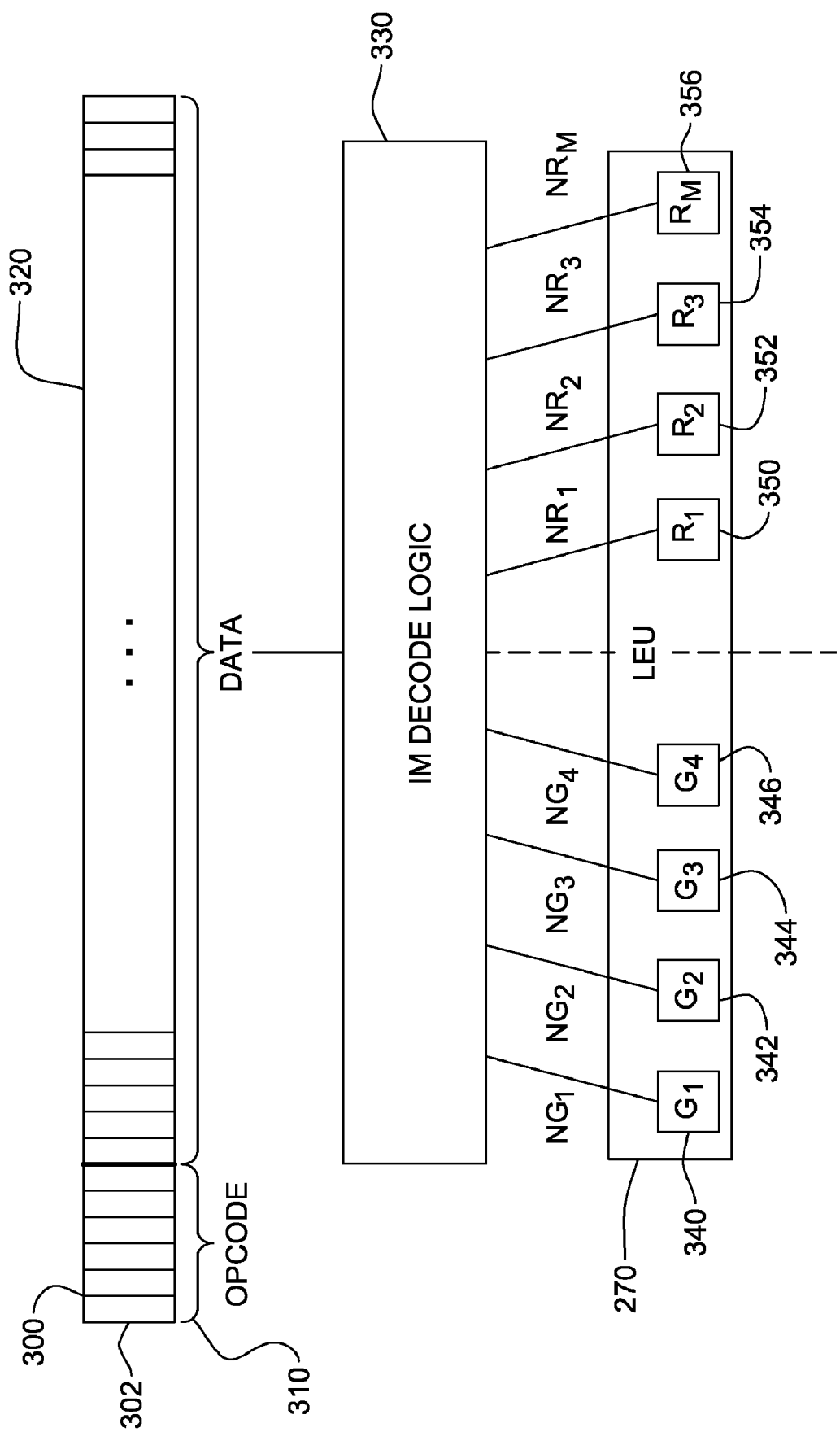
FIG. 3 is a simplified illustration of an encoded instruction to be used in a hardware simulator in accordance with embodiments described herein.

FIG. 3 is an illustration of a generic instruction 300 within memory 240 of model 216 and may be considered an example of the memory instruction 250 described above. Instead of programming instructions for all hardware resources in every cycle as is done now (see FIG. 1), bits 302 in the instruction 300 are set aside as an instruction code or opcode 310. Based on the opcode 310, certain hardware resources are programmed and others aren't by other bits 302 comprising the data part 320 of the instruction 300. The unprogrammed hardware resources can retain their previous value, be reset to a default value, or an original value, as appropriate. Certain opcodes 310 may designate gate evaluation and/or for routing instructions. The entire instruction 300 is input from memory 240 into an instruction memory decode logic 330 which first decodes the opcode 310. Then, depending upon the opcode 310, data bits 320 are decoded to set those hardware resources 340, 342, 344, 346, 350, 352, 354, and 356 as encoded by the opcode 310. When the opcode 310 requires gate evaluations of gates with one, two, three or four inputs, the number of bits will increase with the number of inputs to each gate, and therefore the number of bits remaining to program routing resources in the same instruction decreases. Data bits 320 can be used to designate where to route the data among hardware routing resources, such as R1 350 and/or Rm 356. Routing resources may be used to select a value to be sent, received, stored or retrieved. Routing resources may also be used to select the source or destination of a particular value used in gate evaluations.

Figure 4:
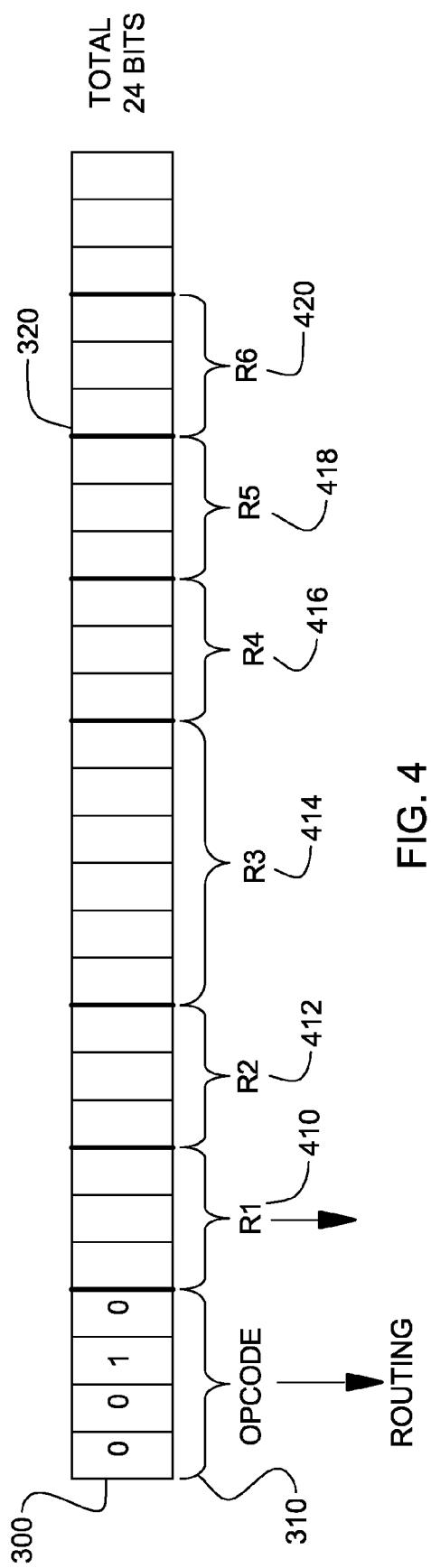
FIG. 4 is a simplified illustration of an example of an encoded instruction that can be used for routing in a hardware simulation accelerator.

FIG. 4 is one example of a routing instruction 300. The decode logic 330 will first read the opcode 310 and based on the opcode, determine the instruction 300 is a routing instruction. The remaining bits 320 may then be decoded to program the hardware resources as necessary for routing the signals through the hardware simulation accelerator. By way of example only and certainly not to be limiting in any way, the next three bits 410 may be used to select a hardware resource R1, such as a gate or a net from which to select data for gate evaluation. The next three or four bits 412 may designate hardware resource R2 to, e.g., refresh a signal in a shift register to keep the signal in its current state. The next six bits 414 and the remaining fields 416, 418, and 420 may be used to designate a particular source or a particular destination of the signal, e.g., other hardware resources on the same chip or to specify a processor, or to designate routing to/from a different chip, or a processor off the chip, or to/from an array processor, etc., These fields are given by way of example only and are intended to teach that these fields are programmable for different routing resources. In one instance, because there are multiple inputs to multiplexers, it is preferable to select the source of the input to the multiplexer. In another instance, it may be preferable to designate an output of the multiplexer. Thus, one example of a routing resource that select a source is a multiplexer which has many inputs, i.e., sources, and a fixed output. An example of a routing resource the selects a destination is an address of a write port or a destination address to be sent on a connected bus. In any event, a routing resource may program either a value or a source of an input signal or a destination of an output signal. One or more of the routing resources R1 410 through R6 420 could be used to select a value to be sent, received, stored or retrieved, as explained above.

Figure 5:
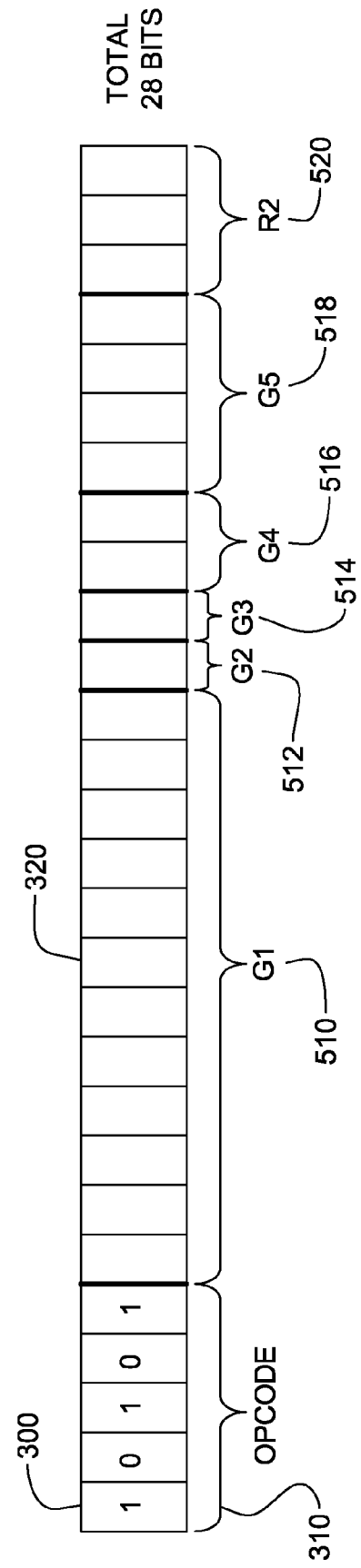
FIG. 5 is a simplified illustration of an example of an encoded instruction that can be used for logic gate evaluation in a hardware simulation accelerator.

FIG. 5 is an example of an instruction 300 having opcode 310 that may indicate evaluation of gate logic. Again, the particular number and values of bits used to program the opcode 310 are determined by the logic design and hardware simulation accelerator. A number of data bits 320 may be programmed or coded to program the values of hardware resources that are identified by the opcode 310, such that hardware resource G1 510 and G2 512 and G3 514 and G4 516 and G5 518 have been identified to, e.g., select operands, route data from/to other hardware resources, and select values for one or more hardware resources, etc. Any number of programmable functions or values can be set for gate evaluation and/or routing; in this case, a breakpoint may be encoded by a hardware resource programmed by some of the bits of the data part of the instruction. Refresh and/or routing instructions to/from a particular hardware resource R2 may also be included in any instruction. Thus, for this particular gate evaluation, 28 bits of the instruction were used, whereas in a prior art instruction 74 or more bits were used to code the very same instruction with many of the bits being unused.

FIGS. 6A and 6B are examples of a staged instruction for gate evaluation of a gate having more inputs than could be represented by a single encoded instruction. Thus, the instruction 300 may have two stages: a first stage represented by a first instruction 300 in FIG. 6A and a second stage represented by a second instruction 300 of FIG. 6B. Because of the number of inputs to this gate, more data bits 320 may be required to select the operands as input, e.g., operand select 610 of FIG. 6A and operand select 612 of FIG. 6B. Similarly, certain values and/or sources and/or destinations, refreshment of values, specific functional evaluations, etc. can be programmed in the data part 320. A function table is one way to implement logic evaluation and when there are up to four inputs to a logic gate, 16 bits of a memory instruction are necessary to evaluate the function for a gate.

One of skill in the art will recognize that the number of inputs to a gate is not intended to limit the embodiments herein. Other bits in the memory instruction are needed to select the operands for the function selected, the number of shift registers, the number of read ports, for routing, for array ports, for processor cores, to refresh a signal, for evaluation of a signal, etc. All of these functions are implemented in the hardware simulation accelerator as multiplexers and selectors which read or select particular bits from the instruction. Some bits of the instruction may be used to select the operands or to force a value of an operand; some bits may be used to set breakpoints on errors or other conditions, some bits may be used to set the condition for the breakpoint, some are for routing resources between processors, between arrays, between chips, etc. The description of the bits described herein is intended only to be illustrative and not limiting. The use of the bits in the instructions will actually be determined by the logic design being evaluated.

FIG. 7 is only one representation of the encoded instructions created and used as taught herein. The instructions are represented by the rows of the table and the columns of the table represent an opcode 710 and portions of a data part 720. Each instruction has an opcode 710 and a data part 720. The opcode 710 determines which hardware resources, G1 through G5 and R1 through R8, to set for the instruction. The data portion 720 contains the values to set those selected hardware resources. In other words, the opcode 710 encodes a selected hardware resource. The opcode 710 further encodes that portion of the data part of the instruction that applies to the selected hardware resource(s). Note that different opcodes 710 encode different hardware resources, e.g., opcode 100+00 encodes hardware resources G1, G3, G4, G5, R2, R4, R5 and R6; and the values within those columns of that instruction 100+00 provide the values to which to set those hardware resources. Opcodes 010 and 011 may represent the first stage of a multiple stage instruction encoding gate evaluation for a logic gate having more inputs than can be represented by a single instruction. Opcodes 110+00, 110+01, 110+10, 110+11, and 111 may encode the second or other stages of the multiple stage gate evaluation and/or routing instructions. Notice that the last column represents the number of bits that are used to implement a particular instruction. Given an instruction memory having a width of 512 bytes or more, one of skill in the art will appreciate that many encoded instructions can be within a single width of the instruction memory of the hardware simulation accelerator, whereas in the prior art, the number of instructions was much less.

Figure 8:
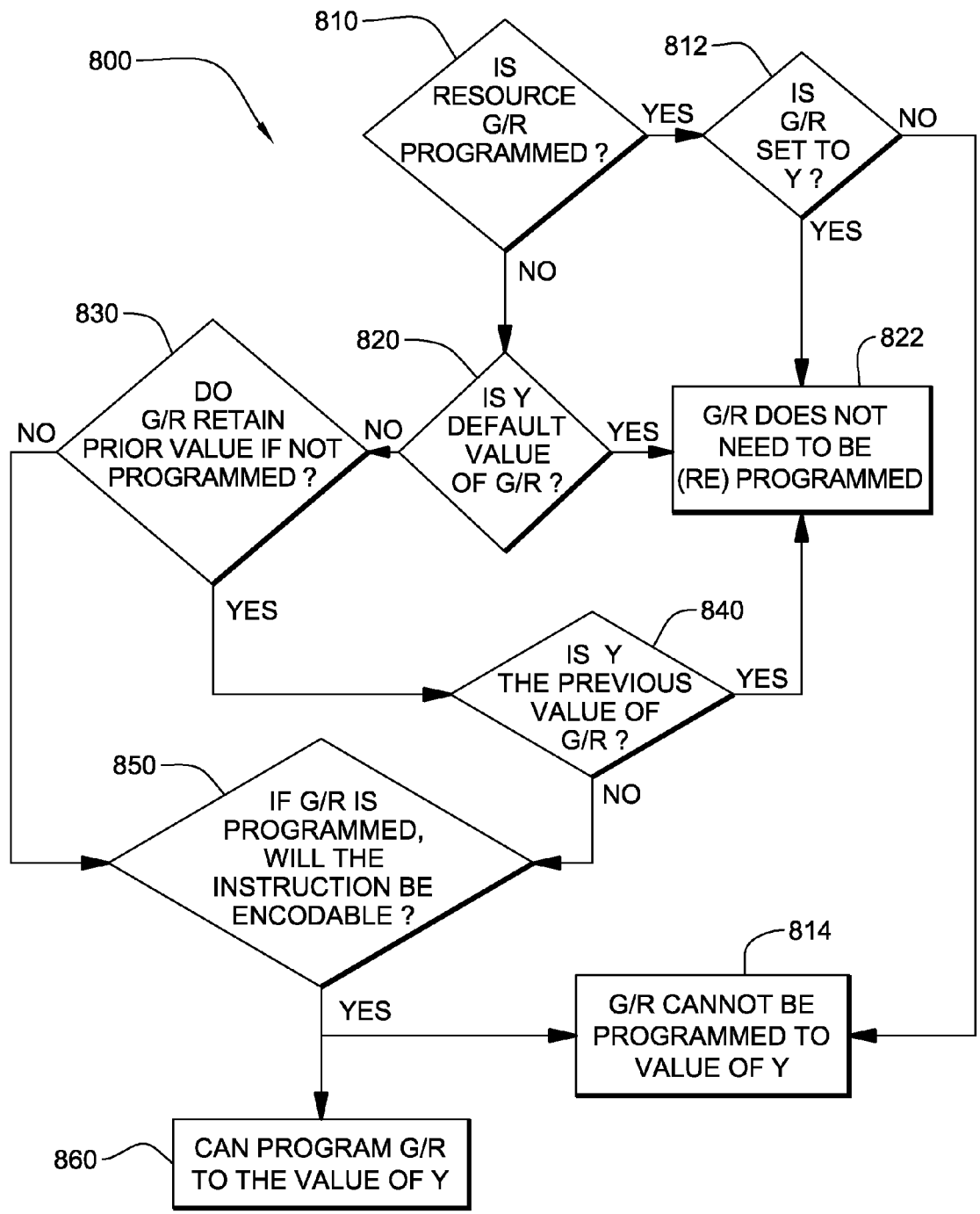
FIG. 8 is a simplified flow chart of a method by which a compiler associated with a hardware simulation accelerator decides to program a hardware resource in accordance with an embodiment of the invention.

FIG. 8 is a simplified chart of the process undertaken within the instruction encoder 800 in the compiler when deciding to program a particular hardware resource to a particular value. The steps of the flow chart occur during compilation of the netlist of a logic design every time the compiler programs the use of a hardware resource within the hardware simulation accelerator. In step 810, the instruction encoder determines if a hardware resource is programmed. If yes, then in step 812, the instruction encoder determines if the hardware resource is already set to a particular value Y. If not, then in step 814, the hardware resource cannot be programmed to a value Y and compiler considers either another hardware resource or another value. If, in step 812, the hardware resource is set to Y, then in step 822, the hardware resource does not need to be programmed or reprogrammed.

If in FIG. 8, the hardware resource is not already programmed at step 810, then the instruction encoder 800 determines if Y is the default value of the hardware resource in step 820. If so, then the process continues to step 822 because the hardware resource does not need to be programmed or reprogrammed. If Y is not the default value of the hardware resource in step 820, then the instruction encoder determines if the hardware resource will resort to a prior or preset value in step 830. If so, then in step 840, the encoder determines if Y is the previous value of the hardware resource in step 840. If so, then the hardware resource does not need to be (re)programmed, as in step 822. If, however, in step 830 the hardware resource does not retain the previous value if the resource is not programmed, then the encoder determines at step 850, if the instruction is encodable, i.e., the encoder determines if there is a suitable opcode and/or data part that can be used to encode the hardware resource to accept the value of Y. If so, then the encoder can create an encoded instruction in accordance with the features herein to program a particular hardware resource to take on a value Y, as in step 860.

Figure 9:
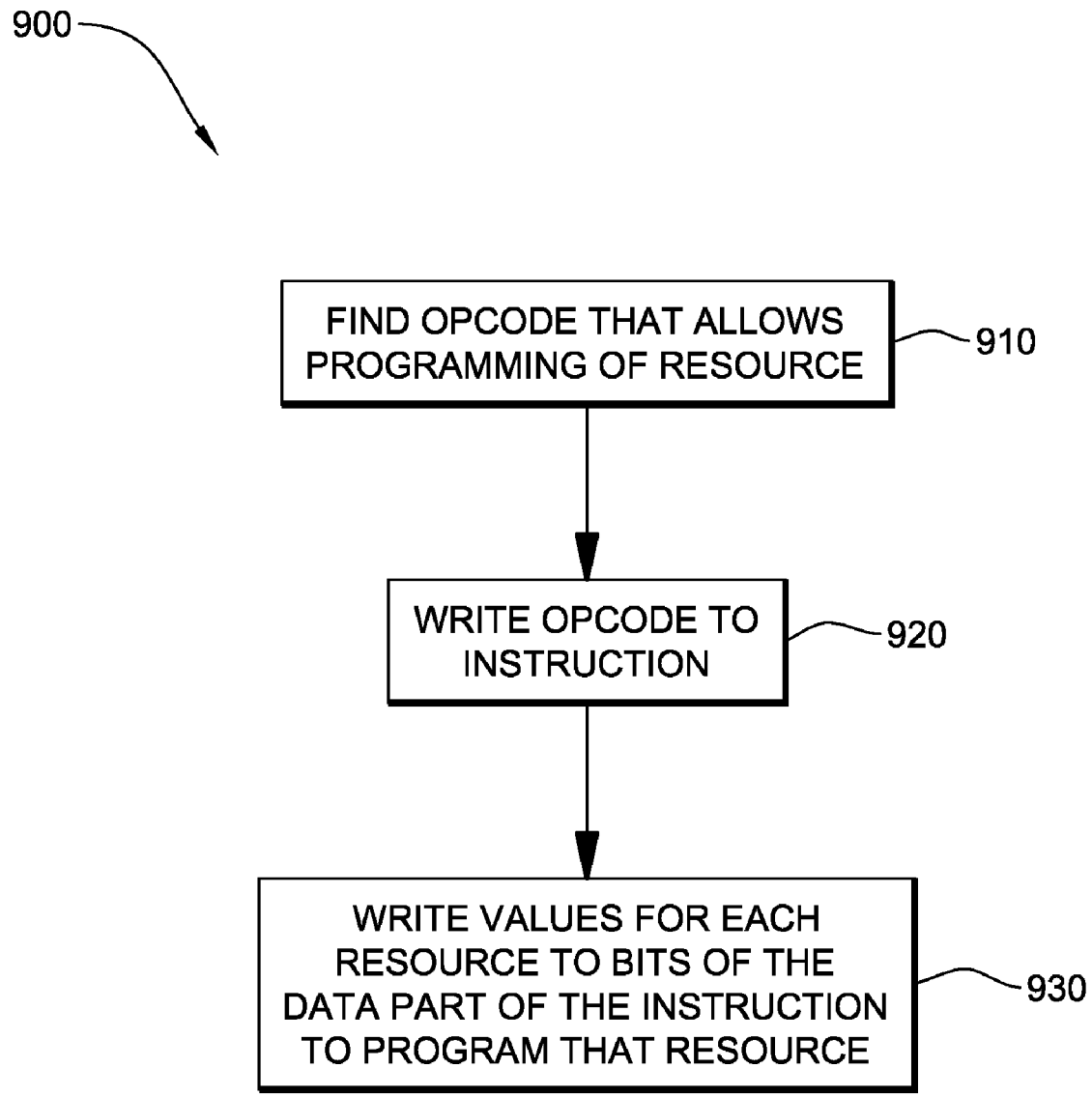
FIG. 9 is a simplified flow chart of a method by which the compiler programs an encoded instruction.

FIG. 9 then is a process chart 900 of the placing the codes into the encoded instruction. Once, as in step 860, the encoder 800 determines it can create an encoded instruction, the encoder 800 then, in step 910, finds an opcode that allows programming of the resource. The opcodes are currently generated manually by an architect or programmer of the hardware simulation accelerator, as will be described. In step 920, the encoder 800 writes the selected opcode to the instruction. In step 930, the encoder 800 of the compiler writes values for each programmable resource indicated by the opcode to bits of the data part of the instruction to program that resource.

Figure 10:
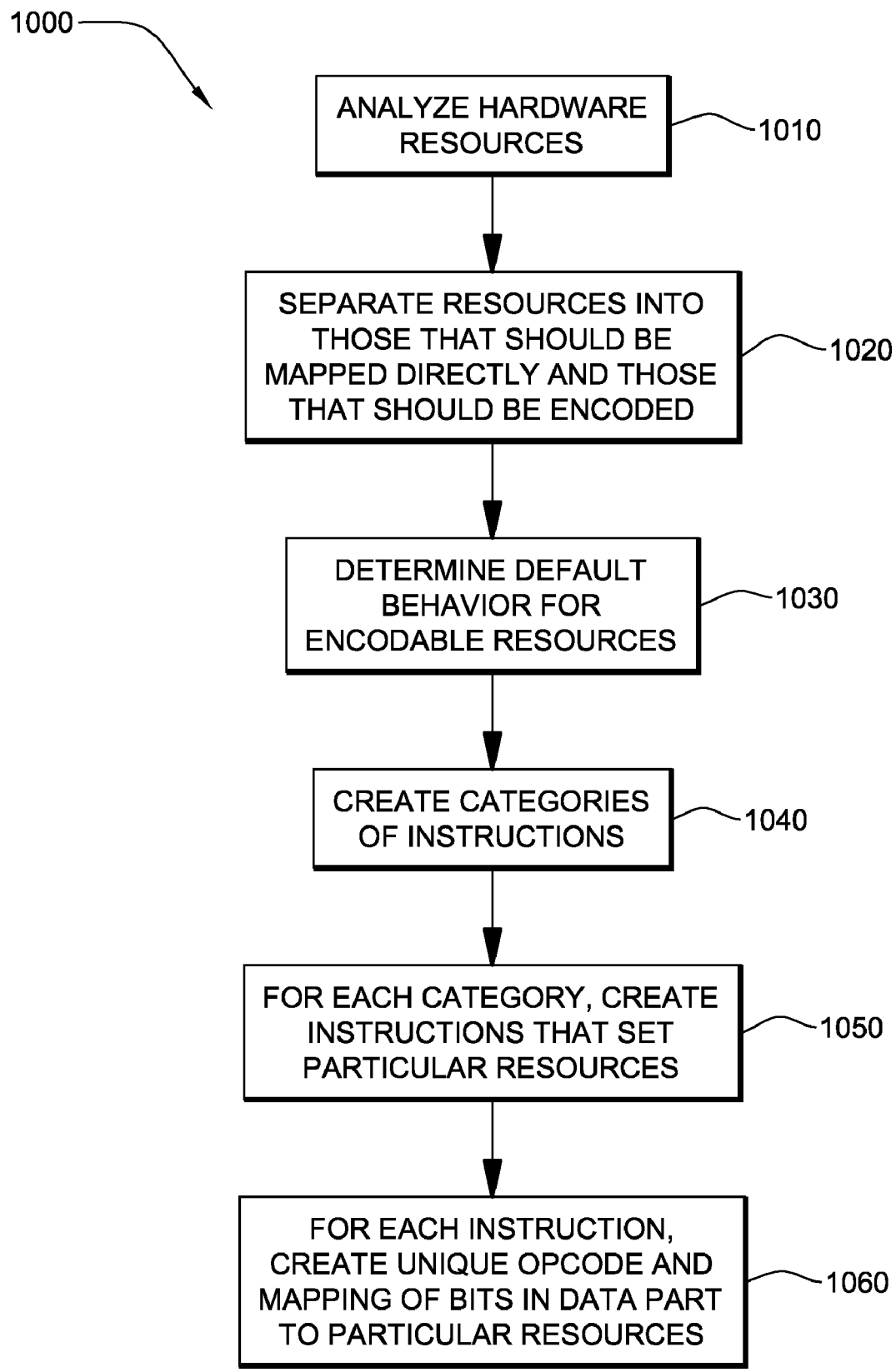
FIG. 10 is a simplified flow chart of a method by which a developer may create encoded instructions for hardware resources in a hardware simulation accelerator.

How a developer or an architect determines that a hardware resource can be programmable is set forth in the process chart of FIG. 10; it is envisioned, however, that logic can be programmed as an expert system or other application to perform these services. In step 1010, the analyzer 1000 analyzes the hardware resources of the hardware simulation accelerator. The analyzer 1000 then, in step 1020, separates those hardware resources into those that should be mapped directly and that that should be encoded, such as for instance, considering how often the hardware resources are used and whether their value may frequently change. Recall, that the hardware resources may comprise but are not limited to read ports, write ports, multiplexers, arrays ports, processor cores, shift registers, other chips, other processor cores, etc. If a specific hardware resource is used all the time, the inventors discerned that it may not be efficient to encode instructions and better to program the instructions using direct mapping for that hardware resource. But for hardware resources that are likely to be unused or have constant values for a limited time, or for hardware resources that are used only in combination with other hardware resources, then encoding the instructions for those hardware resources are useful. For hardware resources involved in gate evaluation, the number of inputs is determined. Some logic designs may require evaluations of gates requiring, for example, four or more inputs. Not all gates, however, actually have four or more inputs; many gates will have less than four inputs, so some bits of the instruction can be programmed or coded for other purposes, preferably related to the gate evaluation. In step 1030, the analyzer 1000 determines the default behavior for those encodable hardware resources. In step 1040, the analyzer 1000 creates categories of instructions. For each category of instruction, in step 1050 the analyzer 1000 will create instructions that set particular hardware resources. In step 1060, for each instruction, the analyzer 1000 creates a unique opcode for those hardware resources and then maps the bits in the data part of the instruction to the resources identified by the opcode. In this fashion, the analyzer 1000 creates the instructions similar to and exemplified by the instruction set of FIG. 7.

According to the preferred embodiments, a simulator system with a hardware simulation accelerator has been described having encoded or programmable instructions that allow for simulation and emulation at an increased capacity than prior art systems. One skilled in the art will appreciate that many variations of the hardware resources, the width of the instruction, and the encoding are all within the scope of the present invention. Thus, while the invention has been particularly shown and described with reference to preferred embodiments thereof, those of skill in the art will understand that these and other changes in form and details do not depart from the spirit and scope of the invention.

What is claimed is:

1. A hardware simulation accelerator having as input a simulation model of a logic design to be simulated in the hardware simulation accelerator, comprising:
    at least one simulator chip having at least one logic evaluation unit having a plurality of programmable hardware resources;
    at least one instruction memory associated with each of the at least one logic evaluation unit in the at least one simulator chip, the instruction memory having a plurality of encoded instructions to simulate the simulation model using the hardware resources, the simulation model defining a first combination of selected ones of the plurality of hardware resources that need not be programmed by one or the plurality of encoded instructions, and one or more second combinations of fewer than all of the plurality of hardware resources to be programmed by one or more of the encoded instructions, each encoded instruction having an opcode indicating the one or more second combinations of hardware resources to be programmed, and a data portion consisting of input data or output data to/from those plurality of hardware resources of the one or more second combinations;
    the logic evaluation unit connected to receive the plurality of encoded instructions from its associated at least one instruction memory;
    an instruction decode logic connected to the at least one instruction memory and its associated logic evaluation unit to decode each of the plurality of the instructions into its opcode indicating how those hardware resources of the one or more second combinations are programmed according to the respective data portion of the instruction.

2. The hardware simulation system of claim 1 wherein the opcode indicates that some of the plurality of encoded bits in the data portion are used to evaluate a logical function in its respective programmable hardware resource in the simulation model.

3. The hardware simulation system of claim 1 wherein the opcode indicates that some of the plurality of encoded bits in the data portion select operands for a logical function to be evaluated in its respective programmable hardware resource.

4. The hardware simulation system of claim 1 wherein the opcode indicates that some of the plurality of encoded bits in the data portion are used to program either a source or a destination of particular programmable hardware routing resources.

5. A method to increase the model capacity of a hardware simulation accelerator having a plurality of hardware resources, the method comprising the steps of: for each of the plurality of hardware resources:
    an expert system executing in a workstation determining how often one of the plurality of hardware resources will be used in simulating a logic design input into the hardware simulation accelerator;
    the expert system executing in the workstation analyzing how often input data to or output data from one of the plurality of hardware resources changes;
    the expert system executing in the workstation analyzing whether particular input data to or output data from one of the plurality of hardware resources is more prevalent than other input or output data so that the particular input data to or output data from the one of the plurality of hardware resources can be a default setting for the one of the plurality of hardware resources;
    the expert system executing in the workstation determining one of the plurality of hardware resources needs to be programmed and determining the input data to or output data from others of the plurality of hardware resources when the one of the plurality of hardware resources is not at its respective default setting;
    creating a plurality of encoded instructions;
    defining a first combination of selected ones of the plurality of hardware resources that will not programmed by one or more of the plurality of encoded instructions;
    defining one or more second combinations of fewer than all of the plurality of hardware resources that are to be programmed by the one or more of the plurality of encoded instructions;
    creating one or more encoded instructions for each one or more second combinations, each encoded instruction having an opcode and a data portion, the opcode indicating which one of the one or more second combinations of hardware resources are to be programmed, and the data portion consisting of the input data to or output data from those ones hardware resources indicated by the opcode.

6. The method of claim 5, wherein the opcode indicates that a plurality of encoded bits in the data portion are input data to or output data from at least one routing hardware resource, where the routing hardware resource may select either a source or a destination of the routing hardware resource.

7. The method of claim 5, wherein the opcode indicates that some of the plurality of encoded bits in the data portion are used to evaluate a logical function in one of the fewer than all of the hardware resources.

8. A method of decoding an encoded instruction to simulate a logic design in a hardware simulation accelerator, the hardware simulation accelerator having a plurality of simulator chips, each of the simulator chips having at least one logic evaluation unit and a respective memory, each logic evaluation unit having a first combination of selected ones of a plurality of hardware resources that need not be programmed by an encoded instruction, and one or more second combinations of fewer than all of the plurality of hardware resources to be programmed by an encoded instruction, the method comprising the steps of:

mapping a partition of the logic design to the at least one logic evaluation unit of one of the plurality of simulator chips;

loading the encoded instruction having a plurality of bits comprising an opcode into the respective memory of the at least one logic evaluation unit;

reading the opcode indicating the one or more second combination of hardware resources to be programmed by the encoded instruction;

programming those one or more second combination of hardware resources according to others of the plurality of bits of the encoded instruction.

9. The method of decoding an encoded instruction to simulate a logic design in a hardware simulation accelerator as in claim 8, further comprising:

determining the decoded instruction is a gate evaluation instruction;

decoding others of a plurality of bits in the encoded instruction to select one or more operands for the gate evaluation instruction.

10. The method of decoding an encoded instruction to simulate a logic design in a hardware simulation accelerator as in claim 9, further comprising:

decoding others of the plurality of bits of the encoded instruction to determine a function to be evaluated by the gate evaluation instruction.

11. The method of decoding an encoded instruction to simulate a logic design in a hardware simulation accelerator as in claim 9, further comprising;

decoding others of the plurality of bits of the encoded instruction to select a source or a destination of the gate evaluation instruction or the routing instruction.

12. A computer program product comprising a computer usable storage medium having computer usable program code that when loaded into a processing device, executes and creates encoded instructions of a simulation model of a logic design to be executed in a hardware simulation accelerator, the computer program product comprising:

computer usable program code to read a netlist of the logic design;

computer usable program code to determine the timing and kinds of a plurality of hardware resources in the hardware simulation accelerator that simulate the netlist of the logic design;

computer usable program code to compile the netlist of the logic design into a simulation model having a plurality of programmable instructions that simulate the netlist in the plurality of hardware resources of the hardware simulation accelerator;

computer usable program code to determine a first combination of the plurality of hardware resources that need not be reprogrammed by the plurality of programmable instructions;

computer usable program code to determine one or more second combinations of fewer than all of the plurality of hardware resources to be programmed by one of the programmable instructions;

computer usable program code to create an opcode for each one of the plurality of programmable instructions to program those hardware resources of the one or more second combination;

computer usable program code to program other fields in the each of the plurality of programmable instructions to implement the operation indicated by the opcode on those hardware resources of the one or more second combination indicated by the opcode.

13. A computer program product comprising a computer usable storage medium having encoded instructions that, when loaded into a computer processing device, executes and simulates a logic design in a hardware accelerator having a first combination of a plurality of hardware resources that need not be reprogrammed to simulate the logic design, and one or more second combinations of fewer than all of the plurality of hardware resources to be reprogrammed to simulate the logic design, each of the encoded instructions having an opcode and a data part, the data part having a plurality of encoded bits wherein the opcode of the encoded instruction indicates which ones of the one or more second combinations of hardware resources to program to simulate the logic design in accordance with the encoded bits of the data part.

* * * * *